(12) United States Patent
Hou et al.

(10) Patent No.: US 8,441,127 B2
(45) Date of Patent: May 14, 2013

(54) BUMP-ON-TRACE STRUCTURES WITH WIDE AND NARROW PORTIONS

(75) Inventors: Fu-Tsai Hou, Hsin-Chu (TW); Liang-Chen Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 26 days.

(21) Appl. No.: 13/172,470

(22) Filed: Jun. 29, 2011

(65) Prior Publication Data

US 2013/0001769 A1    Jan. 3, 2013

(51) Int. Cl.
 *H01L 23/498* (2006.01)
(52) U.S. Cl.
 USPC ............. 257/737; 257/E23.06; 257/E23.144; 257/E23.167; 257/E23.068; 257/775; 257/776; 257/774; 257/773; 257/211; 257/691; 257/207; 257/208; 257/692; 257/666; 257/670; 257/672; 257/667; 257/209; 257/778; 257/779; 257/780
(58) Field of Classification Search .................. 257/737, 257/738, E23.31, 775, 776, 774, 773, 211, 257/691.207, 208, 692, 666, 670, 672, 667, 257/E23.152, E23.144, E23.167, 209, 778, 257/779, 780
See application file for complete search history.

(56) References Cited

U.S. PATENT DOCUMENTS

| | | | | |
|---|---|---|---|---|
| 5,289,037 A | * | 2/1994 | Savignac et al. | 257/776 |
| 5,302,855 A | * | 4/1994 | Matsumoto et al. | 257/774 |
| 5,594,279 A | * | 1/1997 | Itou et al. | 257/758 |
| 5,889,326 A | * | 3/1999 | Tanaka | 257/737 |
| 6,008,532 A | * | 12/1999 | Carichner | 257/691 |
| 6,081,035 A | * | 6/2000 | Warner et al. | 257/773 |
| 6,259,608 B1 | * | 7/2001 | Berardinelli et al. | 361/777 |
| 7,291,923 B1 | * | 11/2007 | Lesea et al. | 257/775 |
| 7,948,094 B2 | * | 5/2011 | Kageyama et al. | 257/786 |
| 8,026,591 B2 | * | 9/2011 | Shibata | 257/692 |
| 2008/0112364 A1 | * | 5/2008 | Kwon et al. | 370/331 |
| 2008/0173477 A1 | * | 7/2008 | Imamura et al. | 174/534 |
| 2011/0215468 A1 | * | 9/2011 | Pendse | 257/737 |
| 2011/0248399 A1 | * | 10/2011 | Pendse | 257/737 |
| 2012/0043672 A1 | * | 2/2012 | Cho et al. | 257/778 |
| 2012/0061824 A1 | * | 3/2012 | Pagaila et al. | 257/737 |
| 2012/0068337 A1 | * | 3/2012 | Pendse | 257/737 |
| 2012/0098120 A1 | * | 4/2012 | Yu et al. | 257/737 |
| 2012/0223428 A1 | * | 9/2012 | Pendse | 257/737 |
| 2012/0228766 A1 | * | 9/2012 | Pendse | 257/737 |

OTHER PUBLICATIONS

Pendse, R.D., et al., "Bond-on-Lead: A Novel Flip Chip Interconnection Technology for Fine Effective Pitch and High I/O Density," 2006 Electronic Components and Technology Conference, IEEE, pp. 16-23.

* cited by examiner

*Primary Examiner* — A O Williams
(74) *Attorney, Agent, or Firm* — Slater & Matsil, L.L.P.

(57) ABSTRACT

A device includes a package component, and a metal trace on a surface of the package component. A first and a second dielectric mask cover a top surface and sidewalls of the metal trace, wherein a landing portion of the metal trace is located between the first and the second dielectric masks. The landing portion includes a first portion having a first width, and a second portion connected to an end of the first portion. The second portion has a second width greater than the first width, wherein the first and the second widths are measured in a direction perpendicular to a lengthwise direction of the metal trace.

20 Claims, 8 Drawing Sheets

BUMP-ON-TRACE STRUCTURES WITH WIDE AND NARROW PORTIONS

BACKGROUND

Bump-on-Trace (BOT) structures were used in flip chip packages, wherein metal bumps are bonded onto narrow metal traces in package substrates directly, rather than bonded onto metal pads that have greater widths than the respective connecting metal traces. The BOT structures require smaller chip areas, and the manufacturing cost of the BOT structures is low. The conventional BOT structures may achieve the same reliability as the conventional bond structures based on metal pads.

The BOT structures used to include a solder mask layer that is formed on the metal traces. The solder mask layer covers portions of the metal traces, and leaves some openings, through which the metal traces are exposed. During the bonding process, solder bumps extend into the openings, and are bonded to the exposed portions of the metal traces. The solder mask layer provides mechanical support for the BOT structures, and the metal traces are unlikely to peel off from the underlying structures.

With the evolving of bump structures, the solder mask layer may be omitted or removed from some areas of the package substrates. For example, in the areas where the metal traces have fine pitches, the solder mask may be removed, while in the areas wherein the metal traces have great pitches, the solder mask may be left un-removed. Accordingly, the metal traces in at least some of the areas of the package substrates are exposed when the bond is formed. However, the metal bumps are typically wider than the metal traces, and hence the solder bonding the metal bumps to the metal traces may shift. Several problems may be resulted due to the metal bump shift. For example, solder bumps may crack, or may bridge to neighboring metal traces, particularly when the solder bumps fail to contact the sidewalls of the metal traces. In addition, the solder bump that is bonded to a metal trace may have solder extension along metal trace surface, and hence the current areas may be reduced. This in turn may cause current entrance areas to be reduced to equal to or smaller than the widths of the metal traces. As a result, the current density in the solder bumps is increased, and high electro-migration is resulted.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A package comprising a bump-on-trace (BOT) structure is provided in accordance with an embodiment. The variations of the embodiment are discussed. Throughout the various views and illustrative embodiments, like reference numbers are used to designate like elements.

Figure 1A:
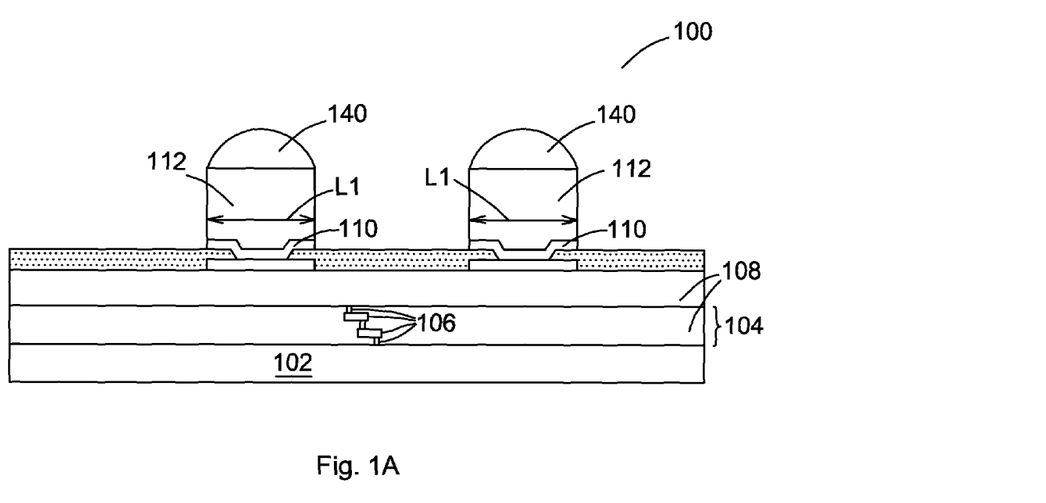
FIG. 1A illustrates a cross-sectional view of a device die including copper posts on a surface.

FIG. 1A illustrates a cross-sectional view of package component 100. Package component 100 may be a device die that includes active devices such as transistors (not shown) therein, although package component 100 may also be a passive component that does not have active devices therein. In an embodiment wherein package component 100 is a device die, substrate 102 may be a semiconductor substrate such as a silicon substrate, although it may include other semiconductor materials. Interconnect structure 104, which includes metal lines and vias 106 formed therein and connected to the semiconductor devices, is formed over substrate 102. Metal lines and vias 106 may be formed of copper or copper alloys, and may be formed using damascene processes. Interconnect structure 104 may include an inter-layer dielectric (ILD) and inter-metal dielectrics (IMDs) 108. IMDs 108 may comprise low-k dielectric materials, and may have dielectric constants (k values) lower than about 3.0. The low-k dielectric materials may also be extreme low-k dielectric materials having k values lower than about 2.5. Package component 100 may further include under-bump metallurgies (UBMs) 110 and copper posts 112 on UBMs 110. Throughout the description, copper posts 112 are also referred to as copper-containing bumps or metal bumps. In an embodiment, solder bumps 140 may be formed on copper posts 112, for example, by plating a solder layer on the top of copper posts 112, and then reflowing the solder layer.

Figure 1B:
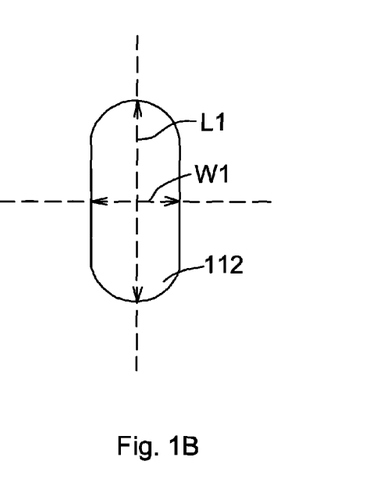
FIG. 1B illustrates a top view of one of the copper posts as shown in FIG. 1A.

FIG. 1B illustrates a top view of one of copper posts 112. In an embodiment, copper posts 112 have an elongated shape having length L1 and width W1, with length L1 being greater than width W1. Copper posts 112 may have an ellipse top view shape, wherein length L1 is the maximum length of the long axis, and width W1 is the maximum length of the short axis. Alternatively, copper posts 112 may have other shapes such as rectangular shapes, square shapes, circular shapes, or the like.

Figure 2A:
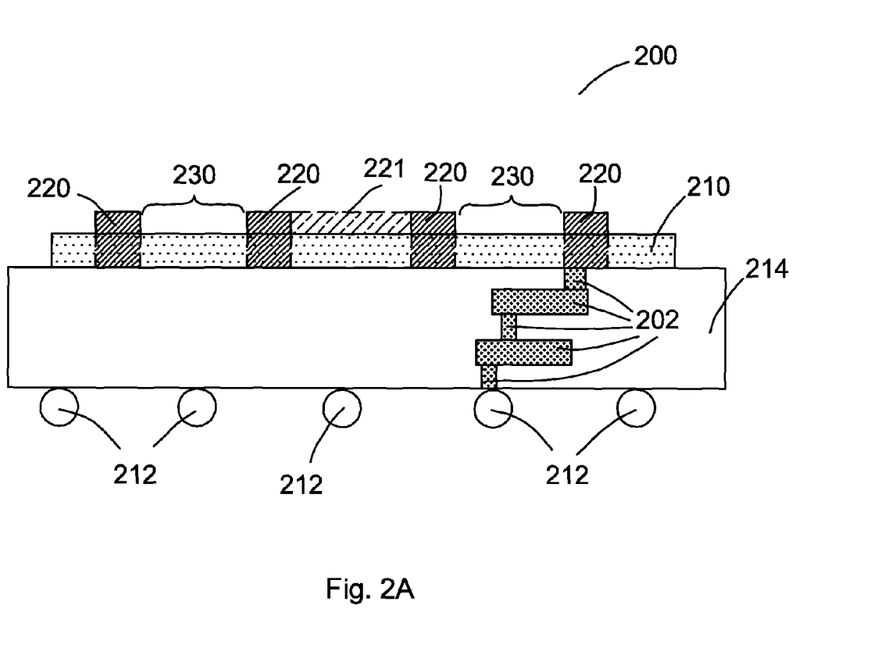
FIGS. 2A and 2D illustrate cross-sectional views of a package substrate including a metal trace on a surface.

FIG. 2A illustrates a cross-sectional view of package component 200. Package component 200 may be a package substrate, although it may be another type of package component such as an interposer, for example. Package component 200 may include metal lines and vias 202 connecting metal features that are on opposite sides of package component 200. In an embodiment, metal trace 210 is located at a surface of package component 200, and is electrically connected to ball grid array (BGA) balls 212 on the bottom side of package components 200 through metal lines and vias 202. Metal lines and vias 202 may be formed in dielectric layers 214, although they may also be formed in a semiconductor substrate (such as a silicon substrate, not shown) and in the dielectric layers that are formed on the semiconductor layer.

Metal trace 210 may be formed of substantially pure copper, aluminum copper, or other metallic materials such as tungsten, nickel, palladium, gold, and/or alloys thereof. Dielectric masks 220 are formed to cover portions of metal trace 210, while other portions of metal trace 210 are not covered. Dielectric masks 220 are in contact with the top surface and the sidewalls of metal trace 210. Dielectric mask 220 may be formed of commonly used solder mask materials such as polymer or other dielectric materials that do not react with solder.

Figure 2B:
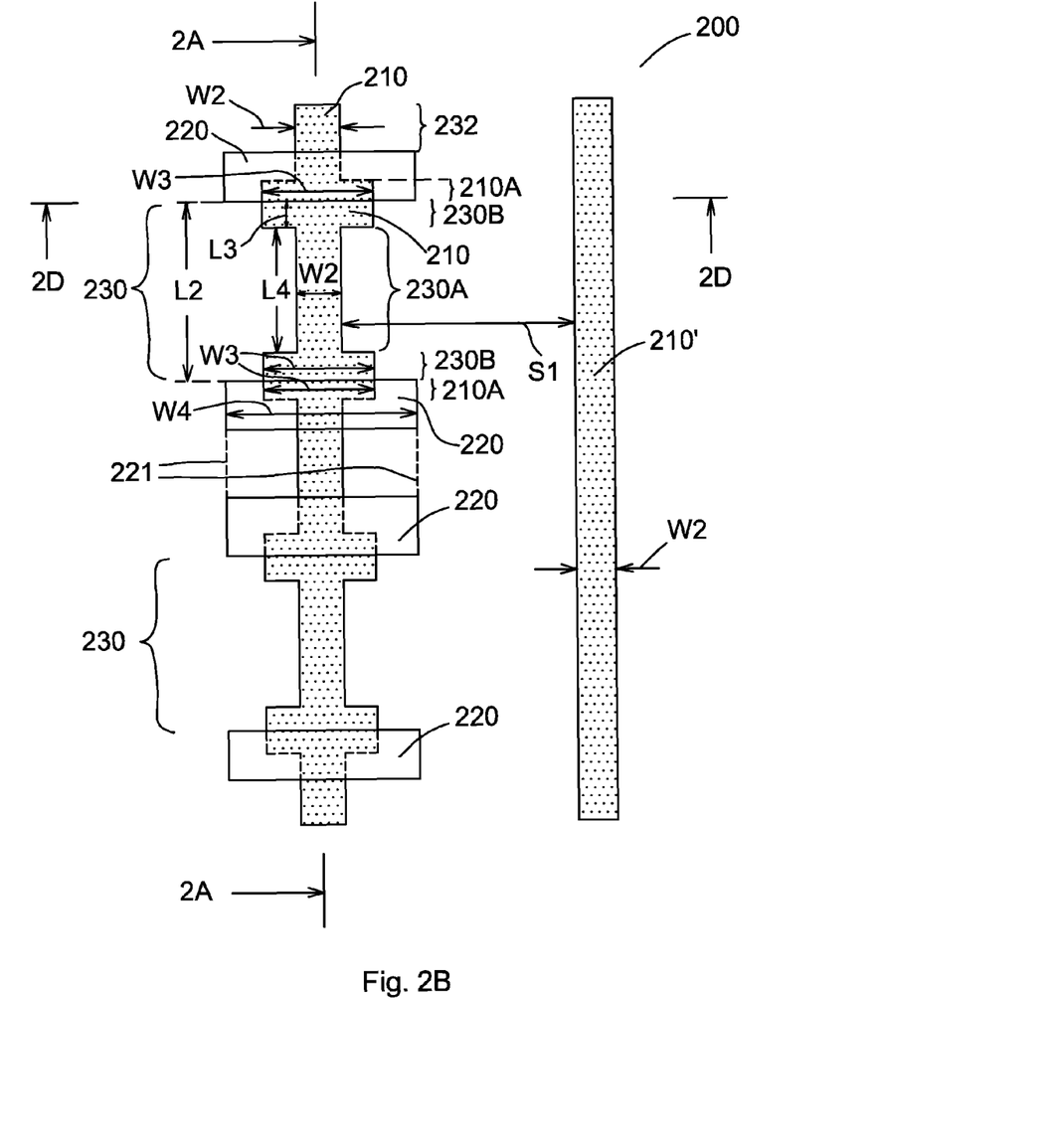
FIGS. 2B and 2C illustrate top views of various package substrates in accordance with embodiments.

FIG. 2B illustrates a top view of a portion of package component 200 shown in FIG. 2A, wherein the cross-sectional view shown in FIG. 2A are obtained from the plane crossing line 2A-2A in FIG. 2B. In an embodiment, dielectric masks 220 are formed in pairs, with two dielectric masks 220 in the same pair being formed adjacent to each other, and covering two portions of metal trace 210. Throughout the description, the portion of metal trace 210 that is between the pair of dielectric masks 220 is referred to as landing portion 230, since this portion is used for landing the solder bump that is used for bonding. Landing portion 230 has length L2, which is also the distance between two dielectric masks 220 that are in the same pair. Landing portion 230 includes narrow portion 230A having width W2, and two wide portions 230B having width W3, wherein width W3 is greater than width W2. In an exemplary embodiment, ratio W3/W2 may be between about 1.2 and about 4, although different ratios may be used. Furthermore, width W3 may be substantially equal to W1. Width W3 may also be smaller than about (2*W2+S1), wherein spacing S1 is the line spacing between metal trace 210 and neighboring metal trace 210'. Metal traces 210 and 210' are immediate neighboring metal traces, with no other metal traces located in between. In an embodiment, width W2 is between about 15 μm and about 25 μm, and width W3 is between about 30 μm and about 60 μm. It is realized, however, that the dimensions recited throughout the description are merely examples, and may be changed. Width W4 of dielectric mask 220 are greater than width W3. Accordingly, dielectric masks 220 may be in physical contact with the top surface and opposite sidewalls of metal trace 210. In addition to the landing portions, metal traces 210 and 210' also include portions not for landing solder bumps. The width of the portions that are not for landing solder bumps may be equal to width W2. For example, the illustrated portion 232 of metal trace 210 is not a landing portion, and its width may be equal to width W2.

Figure 2C:
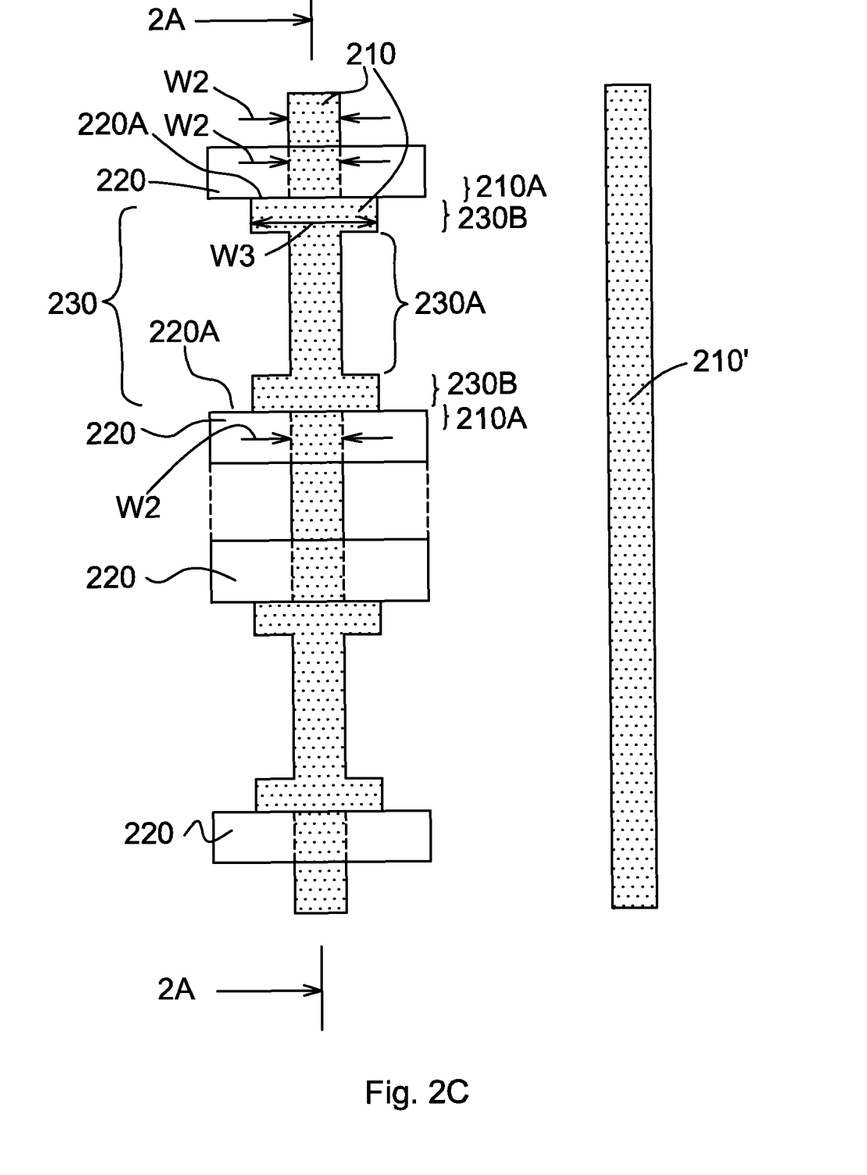

In an embodiment, the two wide portions 230B have a same width W3, although their widths may also be different from each other. Portions 230B are next to, and in contact with, the portions 210A of metal trace 210 that are buried under dielectric masks 220. In an embodiment, as shown in FIG. 2B, the metal trace widths of portions 210A are equal to W3. In alternative embodiments, as shown in FIG. 2C, the metal trace widths of portions 210A are equal to W2. Accordingly, the interface between portions 210A and wide portions 230B may be aligned to edges 220A of dielectric masks 220. In yet other embodiments, the metal trace widths of portions 210A are equal to a value between, and not equal to, widths W2 and W3.

Length L2 of landing portion 230 may be close to length L1 (FIG. 1B) of the respective copper posts 112 that is to be bonded to landing portion 230. For example, length L2 may be between about 90 percent and about 110 percent L1. Length L3 of wide portions 230B may be smaller than value (W3−W2), and may be close to (W3−W2)/2, although different values may be used.

Figure 2D:
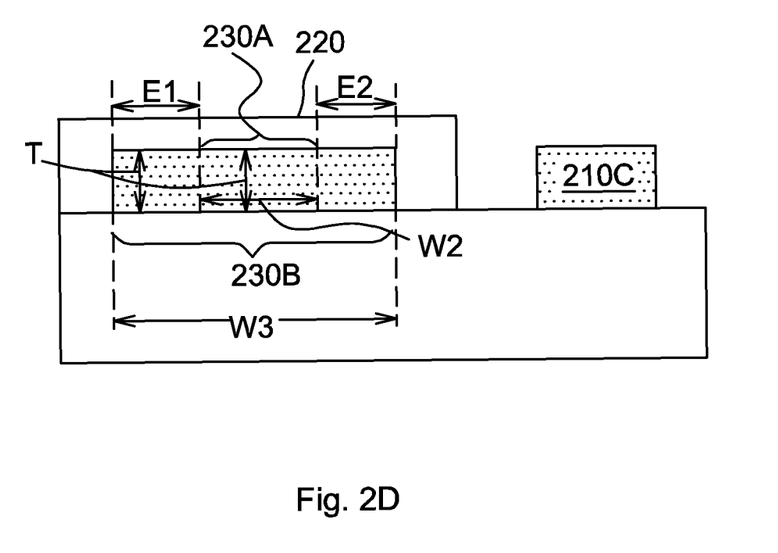

FIG. 2D illustrate a cross-sectional view of the structure shown in FIG. 2B, wherein the cross-sectional view is obtained from the plane crossing line 2D-2D in FIG. 2B. It is observed that narrow portion 230A (with width W2) and wide portions 230B (with width W3) of landing portion 230 may have substantially the same thickness T. Furthermore, narrow portion 230A (W2) may be aligned to the middle of wide portions 230B (W3), with the widths E1 and E2 of the extensions (the portions of wide portions 230B (W3) that extend beyond narrow portion 230A (W2) in the widthwise direction) being equal to each other, although widths E1 and E2 may also be different from each other. Please note that although FIG. 2D shows that mask 220 has a portion over the top surface of portion 230A, as indicated in FIG. 2B, mask 220 does not cover portion 230A. In an embodiment, as shown in FIG. 2B, dielectric masks 220 that belong to different pairs are separated from each other. In alternative embodiments, as shown by dashed lines 221 in FIGS. 2A and 2B, dielectric masks 220 that are next to the neighboring landing portions 230 may be connected to form one dielectric mask region. In an embodiment, dielectric masks 220 do not extend to directly over neighboring metal trace 210', and do not contact neighboring metal trace 210'. In alternative embodiments, one of dielectric mask 220 may extend to directly over and contacting neighboring metal trace 210'.

Figure 3A:
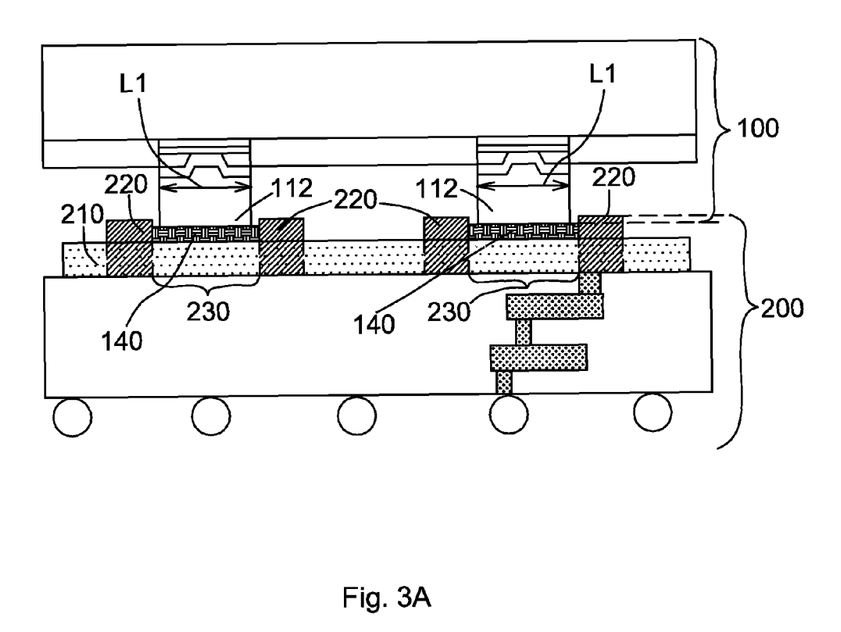
FIGS. 3A, 3B, and 3C illustrate cross-sectional views and a top view of a package, wherein the device die is bonded to the package substrate through a bump-to-trace scheme.

Referring to FIG. 3A, package components 100 and 200 are bonded to each other through solder bumps 140, which may be formed of a lead-free solder, a eutectic solder, or the like. Solder bumps 140 are bonded to, and contact, the top surfaces of metal traces 210, wherein the top surfaces face package component 100. As a result of a self-alignment effect, wherein copper posts 112 are self aligned to the respective landing portions 230 due to the force applied by the melted solder bumps 140, copper posts 112 may be aligned to the middle of landing portion 230. After the bonding of package components 100 and 200, a mold underfill (not shown) may be filled into the space between package components 100 and 200. Accordingly, the mold underfill is also filled into the space between neighboring metal traces 210 and 210', and may contact metal traces 210 and 210'. Alternatively, no mold underfill is filled, while the air fills the space between package components 100 and 200, and fills the space between neighboring metal traces 210 and 210'.

Figure 3B:
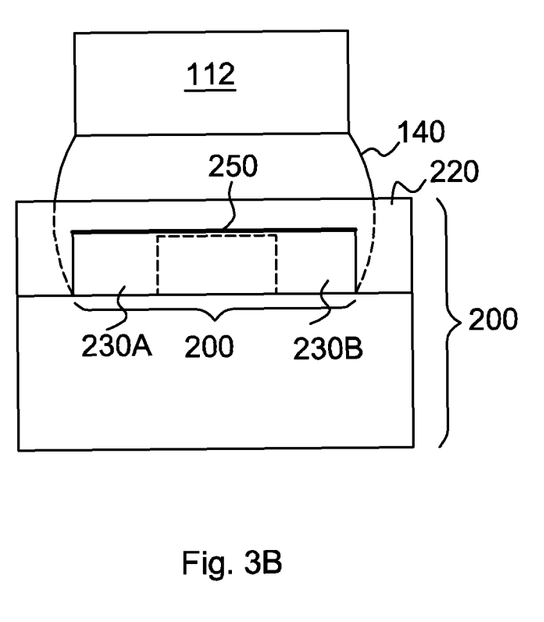

FIG. 3B illustrates a cross-sectional view of the package structure shown in FIG. 3A. As shown in FIG. 3B, solder bump 140 may contact the sidewalls of landing portion 230, and may contact the sidewalls of narrow portions 230A and wide portions 230B.

Figure 3C:
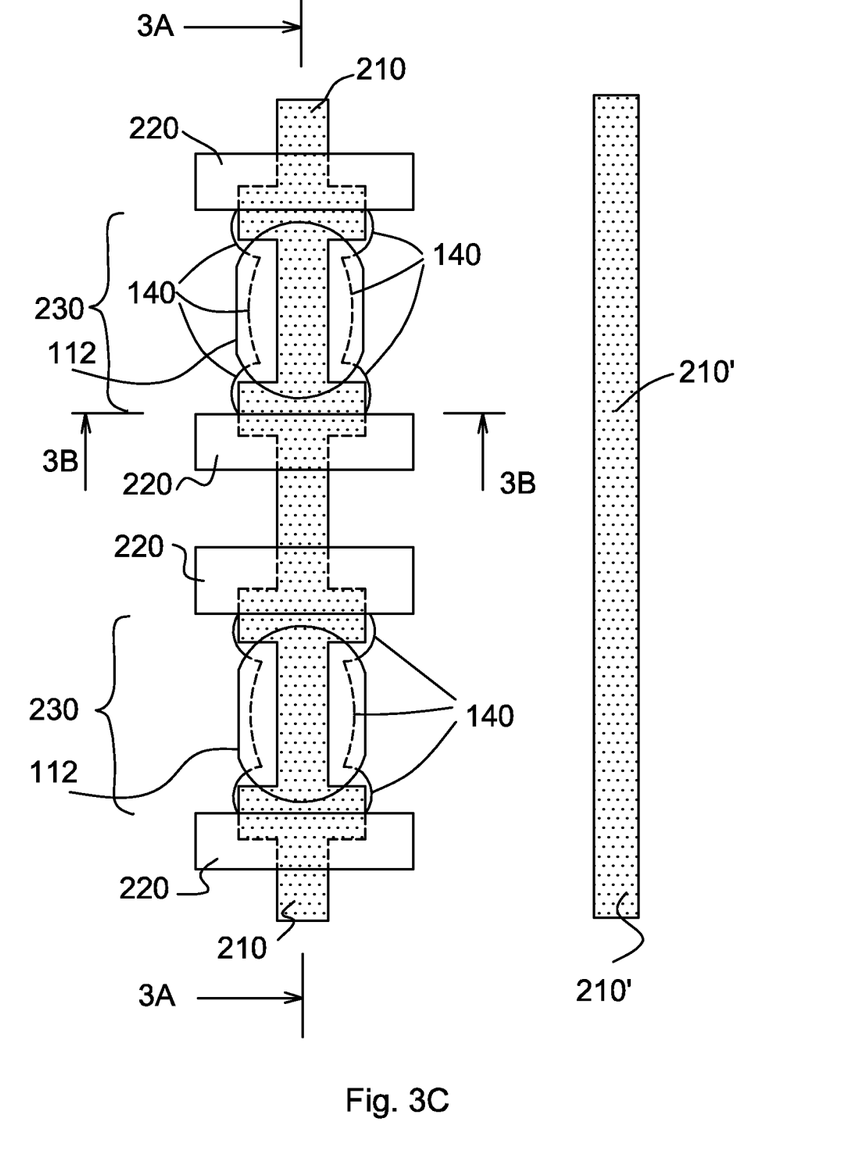

FIG. 3C illustrates a top view of copper posts 112, the respective solder bumps 140, and landing portions 230, wherein the cross-sectional views as shown in FIGS. 3A and 3B are obtained from the planes crossing lines 3A-3A and 3B-3B, respectively, in FIG. 3C. Copper posts 112 may have their long axis parallel to the lengthwise direction of metal trace 210. Solder bumps 140 may land on an entirety of the top surface of landing portion 230. Furthermore, solder bump 140 also contacts opposite sidewalls of wide portions 230B. It is observed that by forming wide portions 230B, the width of the interface between solder bump 140 and landing portion 230 is increased to width W3 from width W2 as compared to the case no wide portion is formed. Accordingly, when currents flow from metal trace 210 to copper post 112 (or in the inverse direction), the current entrance area (shown as pattern 250 in FIG. 3B) is increased. As a result, the current crowding effect in solder bumps 140 is reduced. On the other hand, keeping narrow portions 230A between wide portions 230B help limit the shift of solder bump 140 toward neighboring metal traces 210, and hence the increase in the current entrance area does not result in the adverse increase in solder bridging.

In accordance with embodiments, a device includes a package component, and a metal trace on a surface of the package component. A first and a second dielectric mask cover a top surface and sidewalls of the metal trace, wherein a landing portion of the metal trace is located between the first and the second dielectric masks. The landing portion includes a narrow portion having a first width, and a first wide portion and a second wide portion connected to opposite ends of the narrow portion. The first and the second wide portions have second widths greater than the first width, wherein the first and the second widths are measured in a direction perpendicular to a lengthwise direction of the metal trace.

In accordance with other embodiments, a device includes a device die, and a package substrate free from active devices therein. A copper-containing bump is at a surface of the device die, wherein a long axis of the copper-containing trace bump has a first length, and a short axis of the copper-containing bump has a first width not greater than the first length. A copper-containing trace is on a surface of the package substrate. Two solder masks cover two portions of the copper-containing trace, wherein a portion of the copper-containing trace between the two solder masks includes a first narrow portion having a second width smaller than the first width, and a first and a second wide portion on opposite ends of the first narrow portion. The first and the second wide portions have third widths greater than the second width. A solder bump bonds the copper-containing bump to the copper-containing trace, wherein the solder bump is bonded to, and contacts, a top surface and sidewalls of the portion of the copper-containing trace.

In accordance with yet other embodiments, a device includes a package substrate, and a first metal trace on a surface of the package substrate. A first and a second dielectric mask cover a top surface and sidewalls of the first metal trace, wherein a landing portion of the first metal trace is located between the first and the second dielectric masks. The landing portion includes a narrow portion having a first width, and a first and a second wide portion connected to opposite ends of the narrow portion. The first and the second wide portions have second widths greater than the first width, with the first width and the second widths being measured in a direction perpendicular to a lengthwise direction of the first metal trace. A second metal trace is on the surface of the package substrate and parallel to the first metal trace, wherein the first and the second metal traces are neighboring metal traces with no additional metal trace therebetween. The first and the second dielectric masks do not cover the second metal trace.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a package component;
   a metal trace on a surface of the package component, wherein an entirety of the bottom surface of the metal trace is in contact with an underlying material; and
   a first and a second dielectric mask covering a top surface and sidewalls of the metal trace, wherein a landing portion of the metal trace is located between the first and the second dielectric masks, and wherein the landing portion comprises:
      a first portion having a first width; and
      a second portion connected to an end of the first portion, wherein the second portion has a second width greater than the first width, and wherein the first and the second widths are measured in a direction perpendicular to a lengthwise direction of the metal trace.

2. The device of claim 1, wherein the landing portion further comprises a third portion, wherein the second and the third portions are connected to opposite ends of the first portion, and wherein the third portion has a third width greater than the first width.

3. The device of claim 1 further comprising:
   a device die comprising a metal bump; and
   a solder bump bonding the metal bump to the landing portion of the metal trace, wherein the solder bump contacts sidewalls of the first and the second portions of the landing portion.

4. The device of claim 3, wherein the metal bump has an elongated shape, with a long axis of the metal bump parallel to the lengthwise direction of the metal trace, and wherein the metal bump further comprise a short axis having a width close to the second width.

5. The device of claim 1, wherein the first and the second portions have a same thickness.

6. The device of claim 1 further comprising an additional metal trace adjacent to, and parallel to, the metal trace, wherein no metal trace is located between the metal trace and the additional metal trace, and wherein the second width is smaller than about a sum of twice of the first width and a spacing between the metal trace and the additional metal trace.

7. The device of claim 1 further comprising an additional metal trace adjacent to, and parallel to, the metal trace, wherein no metal trace is located between the metal trace and the additional metal trace, and wherein the first and the second dielectric masks do not cover the additional metal trace.

8. The device of claim 1, wherein the first and the second dielectric masks are in physical contact with sidewalls of the metal trace, and wherein the first and the second dielectric masks have widths greater than the second width.

9. A device comprising:
   a device die;
   a package substrate free from active devices therein;
   a copper-containing bump at a surface of the device die, wherein a long axis of the copper-containing bump has a first length, and a short axis of the copper-containing bump has a first width not greater than the first length;
   a first copper-containing trace on a surface of the package substrate;
   two solder masks covering two portions of the first copper-containing trace, wherein the portion of the first copper-containing trace between the two solder masks comprises:
      a first portion having a second width smaller than the first width; and
      a second and a third portion on opposite ends of the first portion, wherein the second and the third portions have third widths greater than the second width; and a solder bump bonding the copper-containing bump to the first copper-containing trace, wherein the solder bump is bonded to, and contacts, a top surface and sidewalls of the portion of the first copper-containing trace.

10. The device of claim 9 further comprising a second copper-containing trace adjacent to, and parallel to, the first copper-containing trace, with no additional copper-containing trace located between the first and the second copper-containing traces, wherein the two solder masks do not cover the second copper-containing trace.

11. The device of claim 9, wherein the first copper-containing trace further comprises an additional portion buried under one of the two solder masks, wherein the additional portion comprises a fourth portion having the second width, and a fifth portion having a width greater than the second width, and wherein the fifth portion is between, and contacting, the fourth portion and the second portion.

12. The device of claim 9, wherein the first copper-containing trace further comprises an additional portion buried under one of the two solder masks, wherein the additional portion and the second portion have an interface aligned to an edge of the one of the two solder masks, and wherein the additional portion has a width equal to the second width.

13. The device of claim 9, wherein the first width is close to the third widths.

14. The device of claim 9, wherein the portion of the first copper-containing trace between the two solder masks has a second length close to the first length of the copper-containing bump.

15. The device of claim 9, wherein the first, the second, and the third portions have a same thickness.

16. The device of claim 9 further comprising a second copper-containing trace adjacent to, and parallel to, the first copper-containing trace, wherein the third widths are smaller than about a sum of twice the second width and spacing between the first and the second copper-containing traces.

17. A device comprising:
a package substrate;
a first metal trace on a surface of the package substrate;
a first and a second dielectric mask covering a top surface and sidewalls of the first metal trace, wherein a landing portion of the first metal trace is located between the first and the second dielectric masks, and wherein the landing portion comprises:
a first portion having a first width; and
a second and a third portion connected to opposite ends of the first portion, wherein the second and third portions have second widths greater than the first width, with the first width and the second widths being measured in a direction perpendicular to a lengthwise direction of the first metal trace; and
a second metal trace on the surface of the package substrate and parallel to the first metal trace, wherein the first and the second metal traces are neighboring metal traces with no additional metal trace there between, and wherein the first and the second dielectric masks do not cover the second metal trace.

18. The device of claim 17 further comprising:
a third and a fourth dielectric mask covering the top surface and the sidewalls of the first metal trace, wherein an additional landing portion of the first metal trace is between the third and the fourth dielectric masks, and wherein the additional landing portion comprises:
an fourth portion having the first width; and
a fifth and a sixth portion connected to opposite ends of the fourth portion, wherein the fifth and the sixth portions have widths greater than the first width, and wherein the second and the third dielectric masks are between the first and the fourth dielectric masks.

19. The device of claim 18, wherein the second and the third dielectric masks are separated from each other, and wherein a portion of the first metal trace between the second and the third dielectric masks is not covered by any mask that is formed of a same material as the second and the third dielectric masks.

20. The device of claim 18, wherein the second and the third dielectric masks are connected to form a single dielectric mask.

* * * * *